(12) United States Patent  
Yeh

(10) Patent No.: US 7,828,577 B2
(45) Date of Patent: Nov. 9, 2010

(54) SOCKET WITH IMPROVED LOAD PLATE

(75) Inventor: Cheng-Chi Yeh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/482,499

(22) Filed: Jun. 11, 2009

(65) Prior Publication Data

US 2010/0120268 A1    May 13, 2010

(30) Foreign Application Priority Data

Nov. 10, 2008   (TW) .................................. 97143358

(51) Int. Cl.
*H01R 13/62* (2006.01)
(52) U.S. Cl. ...................... 439/331; 439/330
(58) Field of Classification Search ................. 439/331, 439/330, 71, 342
See application file for complete search history.

(56) References Cited

U.S. PATENT DOCUMENTS

| 7,160,130 | B2 |   | 1/2007 | Ma |  |
|---|---|---|---|---|---|
| 7,699,636 | B2 | * | 4/2010 | Ma et al. | 439/331 |
| 2005/0112929 | A1 | * | 5/2005 | Szu et al. | 439/331 |
| 2005/0130477 | A1 | * | 6/2005 | Ma | 439/331 |
| 2005/0142919 | A1 | * | 6/2005 | Lee et al. | 439/331 |
| 2005/0233628 | A1 | * | 10/2005 | Yang et al. | 439/331 |

* cited by examiner

*Primary Examiner*—Hien Vu
(74) *Attorney, Agent, or Firm*—Andrew C. Cheng; Wei Te Chung; Ming Chieh Chang

(57) ABSTRACT

A socket for electrically connecting an IC package to a printed circuit board, comprises an insulative housing, a stiffener surrounding the housing and having a front wall defining a hole; and a load plate pivotably mounted to the front wall of the stiffener. The load plate has a pivotal portion with a hook, the hook has a latching finger engaging with the latching hole of the stiffener, a protruding finger and a gap defined between the latching finger and the protruding finger. The protruding finger resists the stiffener when the load plate deflects on a top-to-bottom direction relative to the stiffener. The protruding finger also can engage with the stiffener to guide the load plate to rotate in a correct direction.

3 Claims, 4 Drawing Sheets

SOCKET WITH IMPROVED LOAD PLATE

FIELD OF THE INVENTION

The present invention relates to a socket, and particularly to a socket for electrically connecting an electronic package such as an IC package and a circuit substrate such as a printed circuit board (PCB). And especially to a socket has an improved load plate which can correctly rotate downwardly.

DESCRIPTION OF RELATED ART

To electrically connect to a printed circuit board, an IC (integrated Circuit) package usually needs a socket, which is disposed between the IC package and the printed circuit board and electrically connects with the IC package and the printed circuit board, respectively, for transferring signals between the IC package and the printed circuit board. A typical connector electrically connecting an IC package to a PCB is described in U.S. Pat. No. 7,160,130, issued to Ma on Jan. 9, 2007. The connector comprises an insulative housing mounted on a printed circuit board, a plurality of contacts received in the insulative housing, a metallic stiffener surrounding the insulative housing, a load plate and a lever pivotally assembled to two opposite ends of the stiffener, respectively. The load plate has two opposite sidewalls, each having a latching portion on an end thereof for the load plate pivoting respect to the stiffener. The stiffener correspondingly defines a pair of latching holes for engaging with the latching portions.

Usually, the latching hole is larger than the latching portion of the load plate, so the latching portion can freely rotate in the latching hole. However, another problem is met, the load plate may swing in left to right direction or even deflect in a horizontal direction during a downward rotation thereof, that may cause that the stiffener or the insulative housing is scraped by the load plate, and the load plate can not correctly engage with the stiffener and make the connector can not work normally.

Hence, a socket with improved load plate is required to overcome the above-mentioned disadvantages of the related art.

SUMMARY OF THE INVENTION

An object of the present invention is to provide a socket, in which a load plate can correctly rotate downwardly.

To achieve the aforementioned objects, a socket for electrically connecting an IC package to a printed circuit board, comprises an insulative housing, a stiffener surrounding the insulative housing and having a front wall defining a latching hole, and a load plate pivotably mounted to the front wall of the stiffener and rotating relative to the stiffener. The load plate is provided with a hook, which has a latching finger latching with the latching hole of the stiffener, and a protruding finger extending forwardly. The protruding finger is disposed lower than the latching finger and resists the stiffener when the load plate deflects in a horizontal direction during a downward rotation of the load plate.

Other objects, advantages and novel features of the invention will become more apparent from the following detailed description of a preferred embodiment when taken in conjunction with the accompanying drawings.

DETAILED DESCRIPTION OF THE INVENTION

Figure 1:
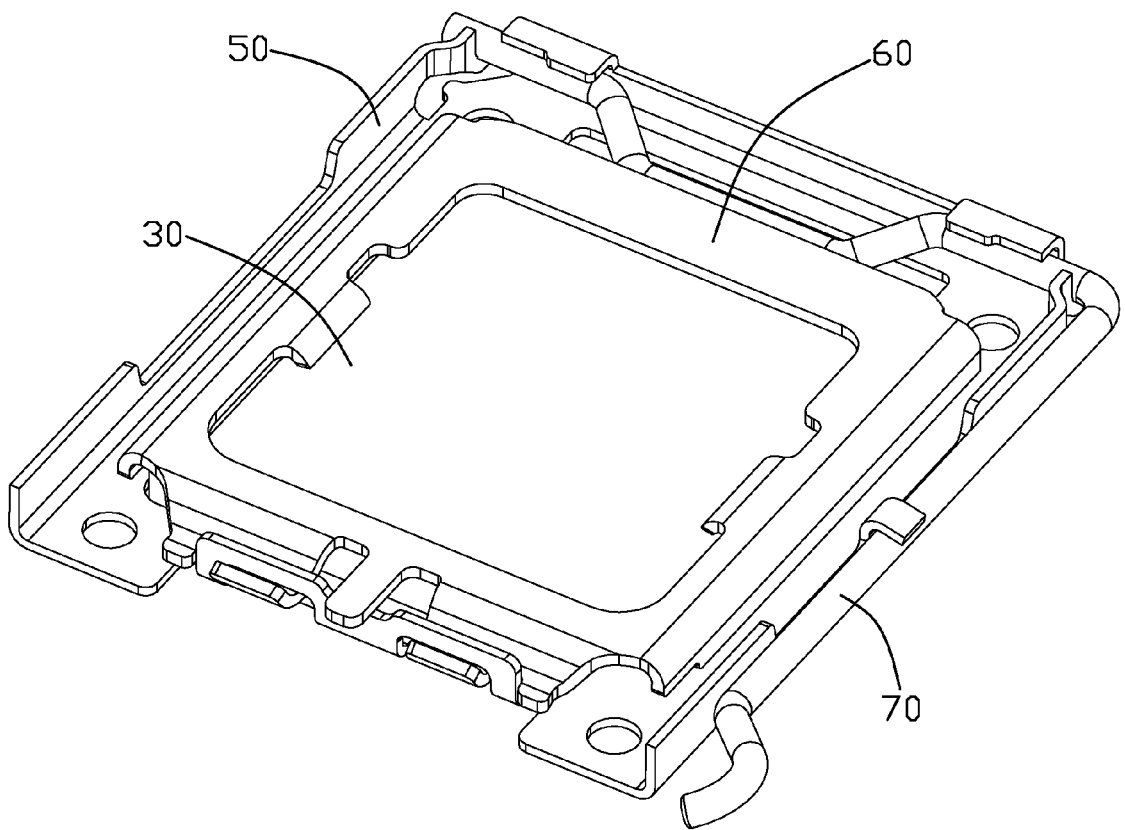
FIG. 1 is an assembled, perspective view of a socket in accordance with the present invention.

Reference will now be made to the drawing figures to describe the present invention in detail. Referring to FIGS. 1-4, a socket 100 in accordance with the preferred embodiment of the present invention is adapted for electrically connecting an IC package (not shown) and a printed circuit board (not shown). The socket 100 comprises an insulative housing 30, a plurality of contacts (not shown) inserted within the insulative housing 30, a stiffener 50 surrounding the housing 30, a load plate 60 rotatably mounted to an end of the stiffener 50 and a lever 70 rotatably mounted to another opposite end of the stiffener 50 and locking with the load plate 60.

Figure 2:
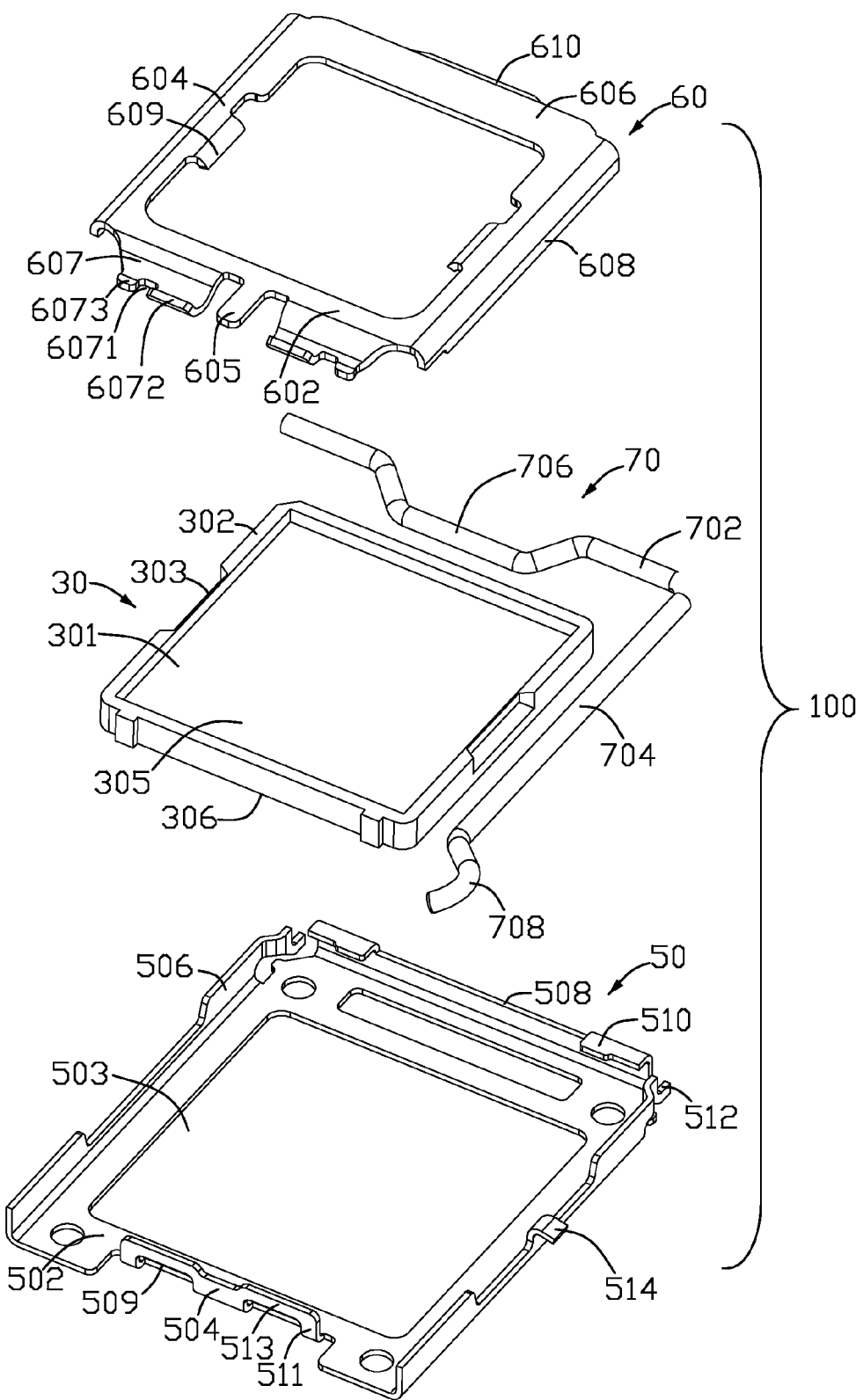
FIG. 2 is an exploded, perspective view of the socket as shown in FIG. 1.
Figure 3:
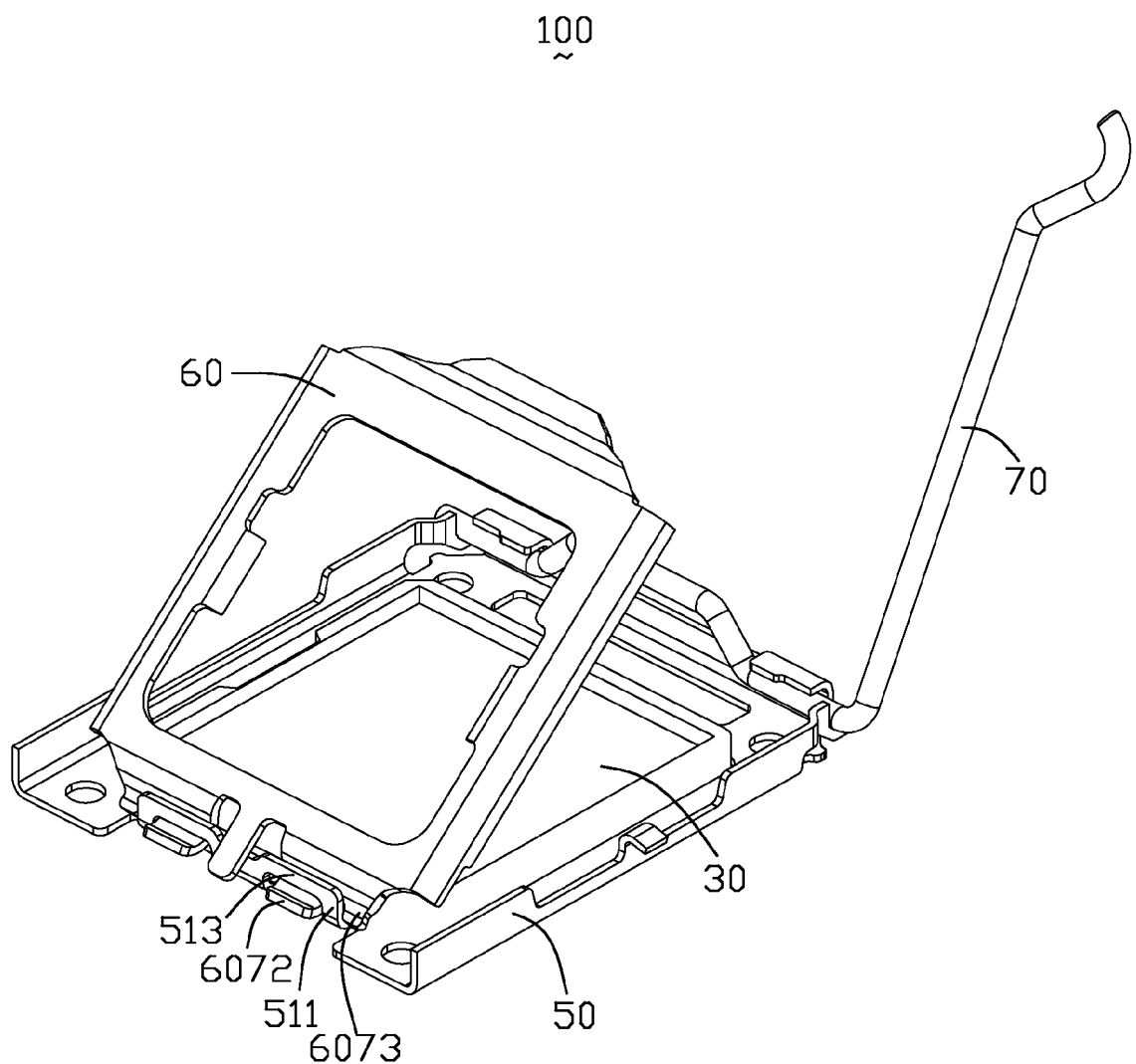
FIG. 3 is another assembled, perspective view of the socket in accordance with the present invention.
Figure 4:
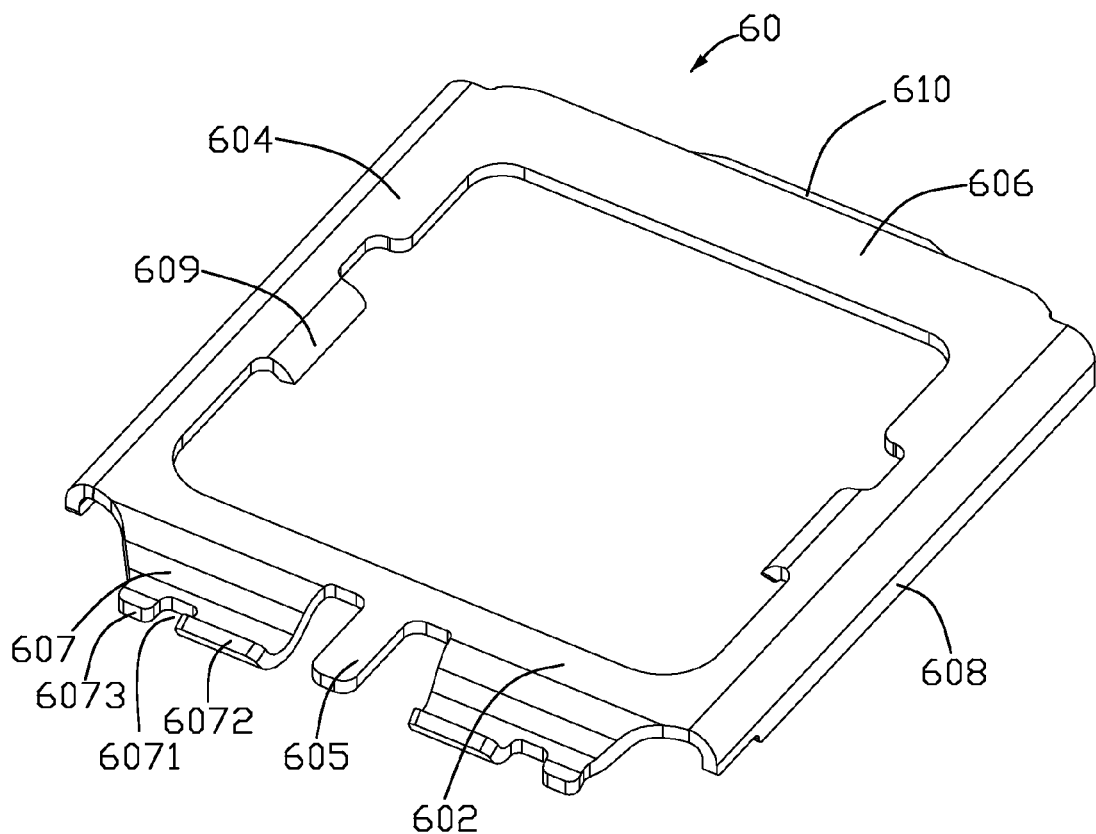
FIG. 4 is a perspective view of a load plate of the socket.

Referring to FIG. 2, the insulative housing 30 is of a rectangular configuration and comprises a loading region 301 for receiving the contacts (not shown), four lateral walls 302 surrounding the loading region 301. The loading region 301 is formed with a top surface 305, a bottom surface 306 opposite to top surface 305 for being mounted to the printed circuit board (not shown), and a plurality of passageways (not shown) extending from the top surface 305 to the bottom surface 306 and arranged in an array. Two opposite lateral walls 302 each defines a finger gap 303 for expediently removing the IC package (not shown) out of the socket 100.

The contact (not shown) received in the passageways (not shown) of the insulative housing 30 to elastically contact with the IC package (not shown) and the printed circuit board (not shown).

The stiffener 50 is stamped from a metallic piece with a frame configuration, and comprises a bottom wall 502, a front wall 504 and a rear wall 508 respectively upstanding from an front and an rear edges of the bottom wall 502 and a pair of sidewall 506 connecting the front and the rear walls 504, 508. The bottom wall 502 defines an opening 503 for receiving the insulative housing 30 therein, the opening 503 is dimensioned smaller than that of the insulative housing 30 to interfere with the lateral walls 302 of the insulative housing 30 to benefit a soldering process of the socket 100. The front wall 504 defines two spaced rectangular latching holes 509 for pivoting with the load plate 60, and a top edge 513 is provided above the latching hole 509, a linking rib 511 links an outside end of the top edge 513 and the bottom wall 502. In another word, the latching hole 509 is corporately defined by the top edge 513, the linking rib 511 and the bottom wall 502. The rear wall 506 is formed with a pair of retaining pieces 510 bent toward the opening 503, each of the sidewall 506 is provided with a supporting piece 512, the retaining pieces 510 cooperate with the supporting pieces 512 to reliably retain the lever 70 on the stiffener 50. Furthermore, one of the sidewall 506 of the stiffener 50 is disposed with an arch clasp 514 on a middle part thereof for retaining the lever 70.

The load plate 60 is a hollow metallic frame configuration, and comprises a pivotal portion 602 pivotally assembled to the stiffener 50, a pressing portion 606 opposite to the pivotal portion 602 for engaging with the lever 70 and a pair of lateral portions 604 connecting the pivotal portion 602 and the pressing portion 606. The pivotal portion 602 has a pair of spaced hooks 607 for engaging with the latching holes 509 of the stiffener 50 and a tail 605 disposed between the two latching portions 6072 to prevent the load plate 60 from over-rotation and scraping the printed circuit board (not shown). The hook 607 has a latching finger 6072, a protruding finger 6073 and a gap 6071 defined between the latching ginger 6072 and the protruding finger 6073, wherein the latching finger 6072 is disposed on an inner side of the gap 6071, and a protruding finger 6073 is disposed on an out side of the gap 6071. The latching finger 6072 inserts into the latching hole 509 to pivotally assemble the load plate 60 to the stiffener 50. The protruding finger 6073 is disposed lower than the latching finger 6072 so as to prevent the load plate 60 from deflection, details will be described later.

When the load plate 60 is pivotally assembled to the stiffener 50, the load plate 60 rotates around the top edge 513. The pressing portion 606 has a tongue 610 pressed by the lever 70 to lock the load plate 60 in a closed position. The lateral portion 604 has an abutting portion 609 protruding inwardly and curved toward the insulative housing 30 to press the IC package (not shown). The lateral portion 604 is formed with an extension portion 608 extending downwardly and vertically from an out edge thereof to limit an offset of the IC package (not shown) during a downward rotation of the load plate 60.

The lever 70 is formed from a metallic shaft, and comprises a retaining part 702 and an operating part 704 perpendicular to the retaining part 702 thereby forming the L-shaped lever 70. The retaining part 702 has an U-shaped bending portion 706 bent inwardly from a middle portion thereof for engaging with the tongue 610 of the load plate 60. The operating part 704 is provided with a handle 708 at a free end thereof.

Referring to FIGS. 1-4, in assembling of the socket 100, firstly, the load plate 60 and the lever 70 are respectively assembled to the front wall 504 and the rear wall 508 of the stiffener 50, then the load plate 60 is rotated to an opened position, finally, the insulative housing 30 together with the contacts (not shown) is then mounted within the opening 503 of the stiffener 50 to mount the insulative housing 30 within the stiffener 50. After assembling is completed, the linking rib 511 of the stiffener 50 is located in the gap 6071 of the load plate 60, the protruding finger 6073 extends out of the latching hole 509.

In operation, the operating part 704 of the lever 70 is rotated upwardly and the load plate 60 is opened to the opened position. The IC package (not shown) is mounted on the loading region 301 of the insulative housing 30 and can electrically connect the printed circuit board (not shown) via the contacts (not shown). When the load plate 60 rotates downwardly to cover the insulative housing 30, if the load plate 60 deflects in a horizontal direction, since the protruding finger 6073 is disposed lower than the latching finger 6072, one of the protruding finger 6073 will firstly resist the stiffener 50 and slide on the stiffener 50 to prevent the load plate 60 from further deflection, which will cause the load plate 60 scrape the insulative housing 30 or the stiffener 50. During a continued downwardly rotation of the load plate 60, the protruding finger 6073 engages with the linking rib 511 to guide the load plate 60 return to correction direction.

However, the disclosure is illustrative only, changes may be made in detail, especially in matter of shape, size, and arrangement of parts within the principles of the invention.

What is claimed is:

1. A socket for electrically connecting an IC package to a printed circuit board, comprising:
   an insulative housing; a metallic stiffener surrounding the insulative housing and having a front wall defining a latching hole; and
   a metallic load plate pivotably mounted on a top wall of the insulative housing and to the front wall of the stiffener and rotating relative to the stiffener, the load plate provided with a hook which has a latching finger latching with the latching hole of the stiffener and a protruding finger extending forwardly, the protruding finger disposed lower than the latching finger and resisting the stiffener when the load plate deflects in a horizontal direction during a downward rotation of the load plate;
   wherein a gap is defined between the latching finger and the protruding finger, the protruding finger is disposed on an outside of the gap;
   wherein the protruding finger of the load plate is lower than the latching finger, so the protruding finger can resist the stiffener to prevent the load plate from further deflection;
   wherein the stiffener comprises a bottom wall, the front wall and a rear wall oppositely extending upwardly from the bottom wall, respectively;
   wherein the front wall of the stiffener is formed with a top edge and a linking rib connecting the top edge with the bottom wall, the gap of the load plate receives the linking rib; and
   wherein there are two spaced hooks, the load plate has a tail between the spaced hooks.

2. The socket as claimed in claim 1, further comprising a lever pivotally assembled to the rear wall of the stiffener.

3. A socket for electrically connecting an IC package to a printed circuit board, comprising:
   an insulative housing;
   a metallic stiffener surrounding the insulative housing and having a front wall which having a latching hole and a top edge above the hole and a linking rib connecting to top edge and disposed on an outside of the latching hole, and
   a metallic load plate pivotably mounted to the front wall of the stiffener, the load plate having a hook, which has a protruding finger and a latching finger, the latching finger inserting into the latching hole of the stiffener and rotating around the top edge, a gap defined between the latching finger and the protruding finger to receive the linking rib of the stiffener;
   wherein the protruding finger engages with the linking rib to guide the load plate to rotate in a correct direction;
   wherein the protruding finger of the load plate is lower than the latching finger, and resists the stiffener when the load plate deflects on a top-to-bottom direction relative to the stiffener;
   wherein there are two spaced hooks, and the load plate has a tail between the spaced hooks;
   wherein the stiffener comprises a bottom wall, the front wall and a rear wall oppositely extending upwardly from the bottom wall, respectively; and
   wherein the front wall of the stiffener is formed with a top edge and a linking rib connecting the top edge with the bottom wall, the gap of the load plate receives the linking rib.

* * * * *